United States Patent
Mårtensson

(10) Patent No.: US 6,869,668 B2
(45) Date of Patent: Mar. 22, 2005

(54) α-ALUMINA COATED CUTTING TOOL

(75) Inventor: Per Mårtensson, Nacka (SE)

(73) Assignee: Sandvik Aktiebolag, Sandviken (SE)

( * ) Notice: Subject to any disclaimer, the term of this patent is extended or adjusted under 35 U.S.C. 154(b) by 206 days.

(21) Appl. No.: 10/073,239

(22) Filed: Feb. 13, 2002

(65) Prior Publication Data
US 2002/0155325 A1 Oct. 24, 2002

(30) Foreign Application Priority Data
Feb. 16, 2001 (SE) ............................................. 0100520

(51) Int. Cl.[7] .............................................. B32B 9/04
(52) U.S. Cl. ..................... 428/216; 428/141; 428/336; 428/697; 428/698; 428/699; 428/701; 428/702; 51/307; 51/309
(58) Field of Search ................................ 428/336, 216, 428/701, 702, 699, 698, 697, 141, 472, 465; 51/307, 309

(56) References Cited

U.S. PATENT DOCUMENTS

| | | | |
|---|---|---|---|
| 3,836,392 A | 9/1974 | Lux et al. | |
| RE29,420 E | 9/1977 | Lindstrom et al. | |
| 4,180,400 A | 12/1979 | Smith et al. | |
| 4,619,866 A | 10/1986 | Smith et al. | |
| 4,701,384 A | 10/1987 | Sarin et al. | |
| 4,702,970 A | * 10/1987 | Sarin et al. | |
| 4,745,010 A | 5/1988 | Sarin et al. | |
| 5,071,696 A | 12/1991 | Chatfield et al. | |
| 5,137,774 A | 8/1992 | Ruppi | |
| 5,654,035 A | 8/1997 | Ljungberg et al. | |
| 5,766,782 A | 6/1998 | Ljungberg | |
| 5,827,570 A | 10/1998 | Russell | |
| 5,834,061 A | 11/1998 | Ljungberg | |
| 5,863,640 A | * 1/1999 | Ljungberg et al. | |
| 5,980,988 A | 11/1999 | Ljungberg | |
| 6,333,103 B1 | * 12/2001 | Ishii et al. | |

OTHER PUBLICATIONS

Lux et al., "Preparation of alumina coatings by chemical vapour deposition", Thin Solid Films, vol. 138, No. 1, pp. 49–64.

Japanese Abstract No. 2001038504A published Feb. 13, 2001.

* cited by examiner

Primary Examiner—Archene Turner
(74) Attorney, Agent, or Firm—Burns, Doane, Swecker & Mathis, L.L.P.

(57) ABSTRACT

A coated cutting tool is composed of one or more layers of refractory compounds of which at least one layer is single-phase α-alumina with a pronounced columnar grain-structure and strong texture in the [300]-direction. The alumina layer is preferably deposited by CVD (Chemical Vapor Deposition) and the preferred microstructure and texture are achieved by adding a second metal halide, and a texture modifying agent, to the reaction gas. When coated cemented carbide cutting tools according to the invention are used in the machining of steel or cast iron, several important improvements compared to prior art have been observed, particularly in the machining of nodular cast iron.

12 Claims, 3 Drawing Sheets

α-ALUMINA COATED CUTTING TOOL

This application claims priority under 35 U.S.C. §§ 119 and/or 365 to 0100520-6 filed in Sweden on Feb. 16, 2001 the entire content of which is hereby incorporated by reference.

FIELD OF THE INVENTION

The present invention relates to a cutting tool for metal machining. More particularly, the present invention relates to a tool having a substrate of cemented carbide, cermet or ceramics and on the surface of said substrate, a hard and wear resistant coating is deposited. The coating is adherently bonded to the substrate and covering functional parts of the tool. The coating is composed of one or more refractory layers of which at least one layer consists of strongly textured alfa-alumina ($\alpha$-$Al_2O_3$).

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

It is well known that for cemented carbide cutting tools used in metal machining, the wear resistance of the tool edge can be considerably increased by applying thin, hard surface layers of metal oxides, carbides or nitrides with the metal either selected from the transition metals from the groups IV, V and VI of the Periodic Table or from the group silicon, boron and aluminium. The coating thickness usually varies between 1 and 15 $\mu$m. The most widespread method for depositing such coatings is CVD (Chemical Vapor Deposition).

The practice of applying a pure ceramic layer such as alumina on top of layers of metal carbides and nitrides for further improvements of the performance of a cutting tool was recognized as is evidenced in Re 29,420 (Lindström et al) and U.S. Pat. No. 3,836,392 (Lux et al). Alumina coated cutting tools are further disclosed in U.S. Pat. No. 4,180,400 (Smith et al), U.S. Pat. No. 4,619,866 (Smith et al), U.S. Pat. No. 5,071,696 (Chatfield et al), U.S. Pat. No. 5,674,564 (Ljungberg et al) and U.S. Pat. No. 5,137,774 (Ruppi) wherein the $Al_2O_3$ layers comprise the $\alpha$- and $\kappa$-phases and/or combinations thereof. For example, in U.S. Pat. No. 4,180,400, an alumina deposition process is disclosed where tetravalent ions of, e.g., Ti, Zr or Hf are added in their halide compositions to the reaction gas mixture in order to deposit essentially a single phase $\kappa$-$Al_2O_3$.

The practice of mixing different metal halides in order to deposit composite ceramic coatings is evidenced in U.S. Pat. No. 4,701,384 (Sarin et al), U.S. Pat. No. 4,745,010 (Sarin et al) and U.S. Pat. No. 5,827,570 (Russell) where processes for depositing mixtures of, e.g., $Al_2O_3$ and $ZrO_2$ are described.

In further efforts to improve the cutting performance of alumina coated cemented carbide cutting tools, particularly in the machining of nodular cast iron, deposition processes yielding fine-grained, single phase $\alpha$-$Al_2O_3$ exhibiting specific crystal orientation (texture) and surface finish are disclosed in U.S. Pat. No. 5,654,035 (Ljungberg), U.S. Pat. No. 5,766,782 (Ljungberg), U.S. Pat. No. 5,834,061 and U.S. Pat. No. 5,980,988 (Ljungberg).

However, the machining of nodular cast iron is still considered to be a demanding metal working operation. This is particularly obvious in heavy and interrupted machining operations where an $\alpha$-$Al_2O_3$ coated tool often suffers from extensive flaking of the alumina layer from the tool substrate.

SUMMARY OF THE INVENTION

It is the object of the present invention to provide onto a hard tool substrate a relatively thick $Al_2O_3$-layer of the alpha polymorph with a desired microstructure and crystallographic texture by utilizing a deposition process with suitable nucleation and growth conditions such that the acquired properties of the $Al_2O_3$-layer provide an alumina coated cutting tool with improved cutting performance in steel, stainless steel, cast iron and, in particular, in nodular cast iron.

According to one aspect of the present invention there is provided a cutting tool for metal machining such as turning (threading and parting), milling and drilling comprising a body of a hard alloy of sintered cemented carbide, cermet or ceramic onto which a hard and wear resistant refractory coating is deposited. Said coating comprises a structure of one or several refractory layers of which at least one layer consists of alumina with a layer thickness of 0.5–25 $\mu$m, preferably 1–10 $\mu$m. The alumina layer consists of essentially single phase $\alpha$-alumina with a pronounced columnar grain-structure.

According to another aspect, the present invention provides a cutting tool comprising: a body comprising sintered cemented carbide, cermet or ceramic; and a hard and wear resistant coating on at least the functional parts of the body, said coating comprising a structure of one or more refractory layers of which at least one layer comprises an alumina layer having a thickness of 0.5–25 $\mu$m, and consisting essentially of single phase $\alpha$-alumina textured in the [300]-direction with a texture coefficient larger than 1.5, the texture coefficient being defined as:

$$TC(hkl) = \frac{I(hkl)}{I_0(hkl)} \left\{ \frac{1}{n} \sum \frac{I(hkl)}{I_0(hkl)} \right\}^{-1}$$

where

I(hkl)=measured intensity of the (hkl) reflection,
Io(hkl)=standard intensity of the ASTM standard,
powder pattern diffraction data, card number 43-1484,
n=number of reflections used in the calculation (hkl) reflections used are: (012), (104), (110), (113), (024), (116) and (300).

According to yet another aspect, the present invention provides a method of producing a coated cutting tool comprising at least one layer of textured $\alpha$-alumina, the method comprising: introducing a tool surface to be coated into a reactive atmosphere comprising $H_2$ and/or Ar; providing the reactive atmosphere with a concentration of oxidizing species below 5 ppm; initiating nucleation of the $\alpha$-alumina layer on the surface by first introducing HCl and $CO_2$ gasses into the atmosphere, than introducing $AlCl_3$ gas into the atmosphere; maintaining a temperature of 950–1050° C. during nucleation of the $\alpha$-alumina layer; and introducing a catalyst and a texture modifying agent into the atmosphere during growth of the $\alpha$-alumina layer.

BRIEF DESCRIPTION OF THE DRAWING FIGURES

DETAILED DESCRIPTION OF THE INVENTION

Figure 1:
FIG. 1 is an SEM image of a cross-section of a layer formed according to the present invention.
Figure 2:
FIG. 2 is an SEM image of a cross-section of a conventional layer.

FIGS. 1 and 2 show Scanning Electron Microscope (SEM) cross-section micrographs at 8000× magnification of an α-alumina layer according to the present invention (FIG. 1) and an $Al_2O_3$-layer according to prior art technique (FIG. 2). FIG. 1 displays the characteristic columnar microstructure and FIG. 2 displays a more coarse-grained microstructure typical of prior art.

Figure 3:
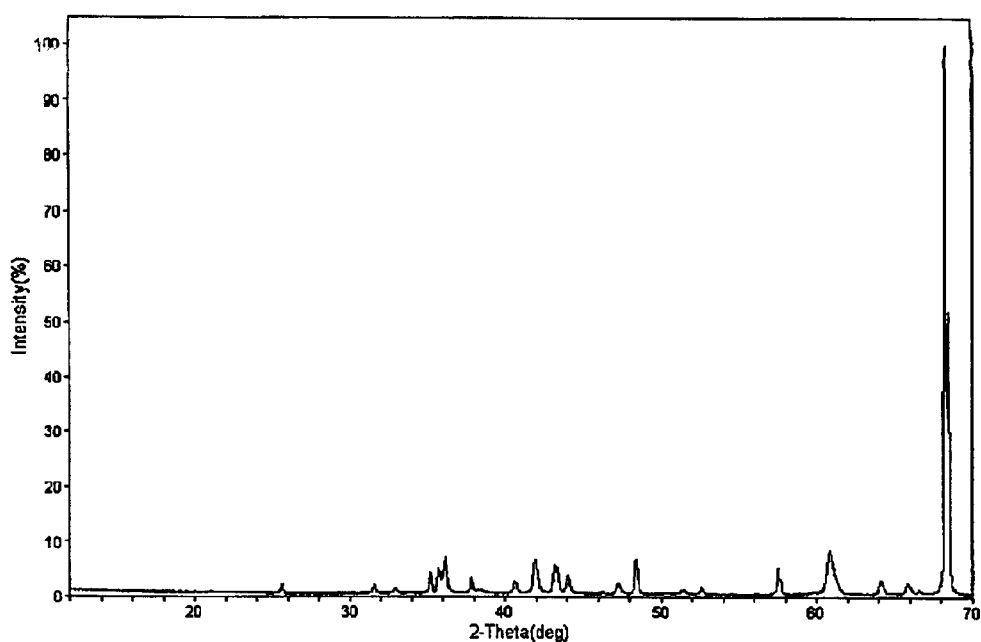
FIG. 3 is an X-ray diffraction pattern for a layer according to the present invention.
Figure 4:
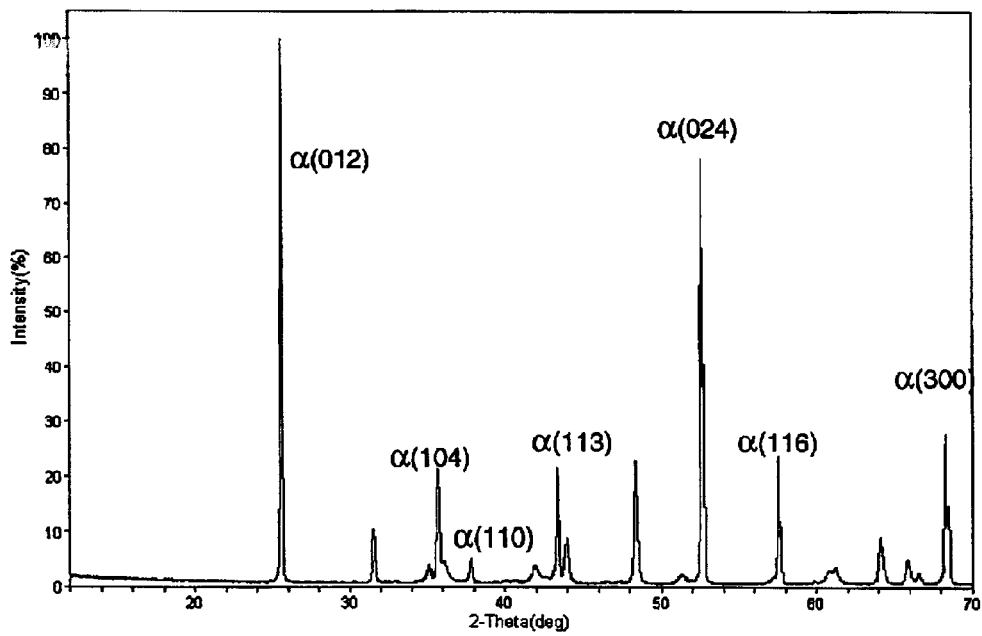
FIG. 4 is an X-ray diffraction pattern for a conventional layer.

FIGS. 3 and 4 show X-ray diffraction patterns for α-$Al_2O_3$ layers deposited according to the invention (FIG. 3) and according to prior art technique (FIG. 4).

Figure 5:
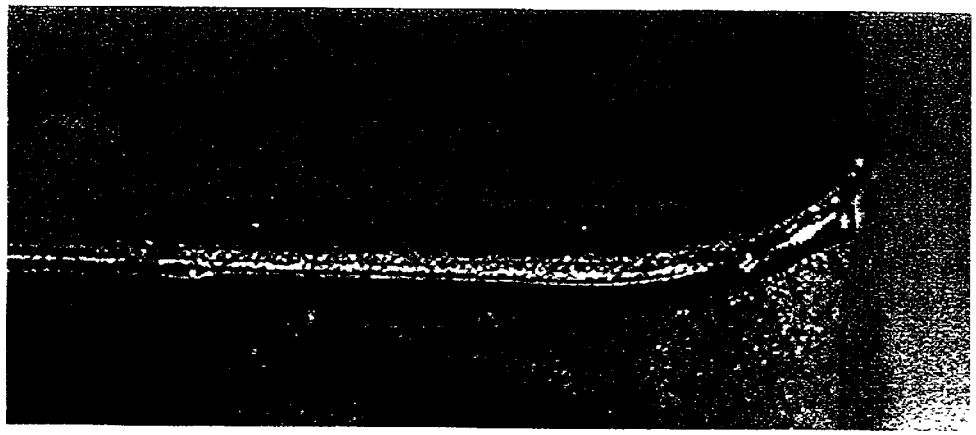
FIG. 5 is a Light Optical microscope (LOM) image of a cutting edge according to the present invention.
Figure 6:
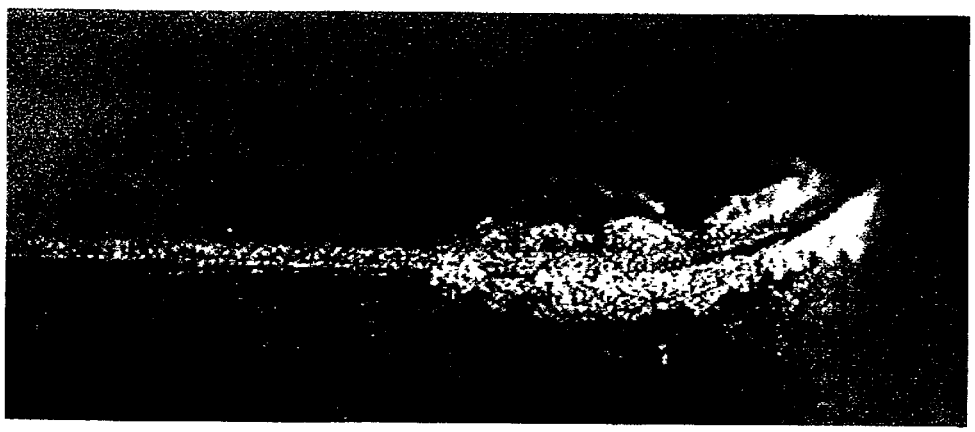
FIG. 6 is an LOM image of a conventional cutting edge.

FIGS. 5 and 6 show Light Optical Microscope (LOM) micrographs of worn cutting edges of a coated cutting insert according to present the invention, FIG. 5, and according to prior art, FIG. 6.

As a consequence of the fine-grained structure perpendicular to the growth direction of the α-alumina layer according to the invention, the cutting edges of the tool obtain a smooth surface finish, which compared to prior art α-$Al_2O_3$ coated tools, results in an improved surface finish also of the workpiece being machined.

The inventive α-$Al_2O_3$ layer may also contain a low concentration of residues of a "texture modifying agent" which may be present in the form of separate grains or in the form of a solid solution with the alumina grains. The concentration of said residues can be 0.01–10, preferably 0.01–5 and most preferably less than 1 percent by weight of the α-alumina coating and the amount of said residues is low enough not to affect the intrinsic properties of the alumina coating itself.

The α-$Al_2O_3$ layer according to the present invention exhibits a preferred crystal growth orientation in the [300]-direction which is determined by X-ray Diffraction (XRD) measurements. FIGS. 3 and 4 show X-ray diffraction patterns for α-$Al_2O_3$ layers deposited according to the invention (FIG. 3) and according to prior art technique (FIG. 4). The very pronounced growth orientation in the [300]-direction is easily perceived from FIG. 3.

A Texture Coefficient, TC, can be defined as:

$$TC(hkl) = \frac{I(hkl)}{I_0(hkl)} \left\{ \frac{1}{n} \sum \frac{I(hkl)}{I_0(hkl)} \right\}^{-1}$$

where

I(hkl)=measured intensity of the (hkl) reflection.

Io(hkl)=standard intensity of the ASTM standard powder pattern diffraction data card number 43-1484.

n=number of reflections used in the calculation, (hkl) reflections used are: (012), (104), (110), (113), (024), (116), (300).

According to the present invention, TC for the set of (300)-crystal planes is larger than 1.5, preferably larger than 3 and most preferably larger than 5.

The applied coating on the cutting tool may in addition to the strongly textured α-$Al_2O_3$ layer(s) contain at least one layer comprising a carbide, nitride, carbonitride, oxycarbide and/or oxycarbonitride of the metal elements ($Me_1$, $Me_2$, ...) selected from the groups IVB, VB and VIB of the Periodic Table or from the group B, Al and Si and/or mixtures thereof, ($Me_1$, $Me_2$, ...)$C_xN_yO_z$, $TiC_xN_yO_z$ being preferred. In a preferred embodiment, the α-$Al_2O_3$ layer according to the present invention is preferably the outermost layer of the coating and the $TiC_xN_yO_z$ layer is the innermost layer of the coating. But metal-$C_xN_yO_z$ layers may also be deposited on top of the alfa-alumina layer(s). In a preferred embodiment the outer layer on top of the outermost α-$Al_2O_3$ layer is TiN.

The textured α-$Al_2O_3$ layer according to the invention is deposited by a CVD (Chemical Vapor Deposition) technique where the tool substrates to be coated are held at a temperature 950–1050° C. and are brought in contact with a hydrogen carrier gas containing one or more halides of aluminium, and a hydrolyzing and/or an oxidizing agent. The oxidation potential of the CVD reactor atmosphere prior to the nucleation of $Al_2O_3$ is kept at a low level with a concentration of water vapor ($H_2O$) or other oxidizing species such as $CO_2$, $O_2$, etc., below 5 ppm. The nucleation of α-$Al_2O_3$ is started up by sequencing of the reactant gases that HCl and $CO_2$ are entering the reactor first in an Ar and/or $H_2$ atmosphere followed by $AlCl_3$. When nucleation of α-$Al_2O_3$ has occurred, a sulphur catalyst, preferably $H_2S$, is added to the reaction gas mixture in order to obtain the enhanced deposition rate.

Surprisingly it has been found that when adding small amounts of $ZrCl_4$ to the reaction gas mixture during the growth period of the α-$Al_2O_3$ layer, a crystallographic structure is attained having a very strong texture in the [300]-direction. The concentration of a second halide, a so-called texture modifying agent, preferably $ZrCl_4$, shall be 0.05–10, preferably 0.2–5 and most preferably 0.5–2 percent by volume of the total reaction gas volume.

The inventive CVD methods described above have made it possible to deposit α-$Al_2O_3$ layers with a desired microstructure and orientation and, said layers can be grown to a relatively large thickness, and surprisingly, still retain its excellent adhesion to the tool substrate as well as adding the desired improvement in wear resistance of the cutting tool which will demonstrated in a forthcoming example. In order to further improve the properties of the coated cutting tool the surface may also be smoothened by a standard brushing technique.

The exact conditions of the CVD process depend to a certain extent upon the design of the equipment being used. It is within the purview of the person skilled in the art to determine whether the requisite texture and coating morphology have been obtained and to modify nucleation and the deposition conditions in accordance with the present specification, if desired, to affect the degree of texture and coating morphology.

The specific examples to follow are intended to be illustrative of the present invention, and not restrictive.

EXAMPLE 1

A) Cemented carbide cutting inserts with the composition 6.0 weight-% Co, and balance WC were coated with a 3 μm thick layer of TiCN in a standard CVD process. In subsequent process steps during the same coating cycle, a 7 μm thick layer of α-$Al_2O_3$ was deposited by the method described below.

A reaction gas mixture comprising $H_2$, HCl and $CO_2$ was first introduced into the CVD-reactor. The reaction gases were sequentially added in the given order. After a pre-set time $AlCl_3$ was allowed into the reactor. During the deposition of $Al_2O_3$, $H_2S$ was used as a catalyst and $ZrCl_4$ as texture modifying agent. The gas mixtures and other process conditions during the α-$Al_2O_3$ deposition steps comprised:

|  | Step 1. | Step 2. |
| --- | --- | --- |
| $CO_2$ | 5% | 5% |
| $AlCl_3$ | 2% | 2% |
| $ZrCl_4$ | — | 1% |
| $H_2S$ | — | 0.3% |
| HCl | 2% | 6% |
| $H_2$ | Balance | Balance |
| Pressure | 55 mbar | 55 mbar |
| Temperature | 1010° C. | 1010° C. |
| Duration | 1 hour | 3 hours |

XRD-analysis showed a texture coefficient, TC(300), of 6.2 (average of ten inserts) of the single α-phase of the $Al_2O_3$-layer. SEM-micrographs showed a 7 μm thick $Al_2O_3$-layer with a pronounced columnar grain-structure as is demonstrated in FIG. 1.

B) Cemented carbide substrate of A) was coated with TiCN (3 μm) and $Al_2O_3$ (7 μm) as set forth in A) except that the $Al_2O_3$ deposition process was carried out according to prior art technique.

The gas mixtures and other process conditions during the $Al_2O_3$ deposition steps comprised:

|  | Step 1. | Step 2. |
| --- | --- | --- |
| $CO_2$ | 5% | 5% |
| $AlCl_3$ | 2% | 2% |
| $ZrCl_4$ | — | — |
| $H_2S$ | — | 0.3% |
| HCl | 2% | 6% |
| $H_2$ | Balance | Balance |
| Pressure | 55 mbar | 55 mbar |
| Temperature | 1010° C. | 1010° C. |
| Duration | 1 hour | 3 hours |

XRD-analysis showed a texture coefficient, TC(300), of 0.9 (average of ten inserts) of the single α-phase of the $Al_2O_3$-layer. The XRD-pattern is displayed in FIG. 4. SEM-micrographs showed a 7 μm thick $Al_2O_3$-coating with an equiaxed grain-structure as depicted in FIG. 2.

EXAMPLE 2

Coated tool inserts from A), and B) were brushed using a standard production method in order to smoothen the coating surface. The cutting inserts were then tested with respect to edge line and rake face flaking in a turning operation, facing in nodular cast iron (AISI 60-40-18, DIN GGG40), a machining test which has proven to be a good benchmark test on the strength of the coating adhesion.
Cutting data:
Speed=250 m/min,
Depth of cut=2.0 mm
Feed=0.2 mm/rev.
Coolant was used.

The results are expressed in the table below as percentage of the edge line in cut on which flaking of the coating has occurred, and furthermore, the rake face area subjected to flaking in relation to the total contact area between the rake face and the workpiece chip. The numbers shown in the table below are average values for 5 tested cutting edges.

| Coating | Edge line flaking | Rake face flaking |
| --- | --- | --- |
| According to A | 4% | <1% |
| According to B | 53% | 62% |

FIGS. 5 and 6 show Light Optical Microscope (LOM) micrographs of worn cutting edges tested according to the above described method. FIG. 5 shows the wear pattern of a coated cutting insert according to present the invention and FIG. 6 shows the wear pattern of coated cutting insert according to prior art technique.

While the present invention has been described by reference to the above-mentioned embodiments, certain modifications and variations will be evident to those of ordinary skill in the art. Therefore, the present invention is limited only by the scope and spirit of the appended claims.

I claim:

1. A cutting tool comprising:
a body comprising sintered cemented carbide, cermet or ceramic; and
a hard and wear resistant coating on at least functional parts of the body, said coating comprising a structure of one or more refractory layers of which at least one layer comprises an alumina layer having a thickness of 0.5–25 μm, and consisting essentially of single phase α-alumina textured in the [300]-direction with a texture coefficient larger than 1.5, the texture coefficient being defined as:

$$TC(hkl) = \frac{I(hkl)}{I_0(hkl)} \left\{ \frac{1}{n} \sum \frac{I(hkl)}{I_0(hkl)} \right\}^{-1}$$

where
I(hkl)=measured intensity of the (hkl) reflection,
Io(hkl)=standard intensity of the ASTM standard, powder pattern diffraction data, card number 43-1484,
n=number of reflections used in the calculation (hkl) reflections used are: (012), (104), (110), (113), (024), (116) and (300).

2. The cutting tool according to claim 1, wherein the alumina layer has a thickness of 1–10 μm.

3. The cutting tool according to claim 1, wherein texture coefficient is larger than 3.

4. The cutting tool according to claim 1, wherein the texture coefficient is larger than 5.

5. The cutting tool according to claim 1, wherein the α-alumina layer contains 0.01–10 percent by weight of residues of a texture modifying agent.

6. The cutting tool according to claim 5, wherein the α-alumina layer contains 0.01–5 percent by weight of residues of a texture modifying agent.

7. The cutting tool according to claim 5, wherein the α-alumina layer contains less than 1 percent by weight of residues of a texture modifying agent.

8. The cutting tool according to claim 1, further comprising at least one layer having a thickness of 0.1–10 μm, comprising a nitride, carbide, carbonitride, oxycarbide and/or oxycarbonitride of titanium and that said layer is in contact with the α-alumina layer.

9. The cutting tool according to claim 8, wherein the at least one layer has a thickness of 0.5–5 μm.

10. The cutting tool according to claim 8, wherein the coating comprises an outer layer, and the outer layer is α-alumina.

11. The cutting tool according to claim 1, wherein the coating comprises an outer layer, and the outer layer is TiN.

12. The cutting tool according to claim 1, the surface of the coated cutting tool is smoothened by means of a brushing operation.

* * * * *